United States Patent
Minegishi (12)
(10) Patent No.: US 6,515,518 B1
(45) Date of Patent: Feb. 4, 2003

(54) ANALOG SWITCH CIRCUIT

(75) Inventor: Atsushi Minegishi, Tokyo (JP)

(73) Assignee: Iwatsu Electric Co., Ltd., Tokyo (JP)

( * ) Notice: Subject to any disclaimer, the term of this patent is extended or adjusted under 35 U.S.C. 154(b) by 0 days.

(21) Appl. No.: 09/703,871

(22) Filed: Nov. 2, 2000

(30) Foreign Application Priority Data

Dec. 10, 1999 (JP) .......................................... 11-350922

(51) Int. Cl.[7] ................................................ H03K 5/22
(52) U.S. Cl. .......................... 327/65; 327/67; 327/563; 330/254
(58) Field of Search .............................. 327/65, 67, 52, 327/54, 55, 563, 356, 353, 358; 455/333; 330/254, 252, 51

(56) References Cited

U.S. PATENT DOCUMENTS

| | | | | |
|---|---|---|---|---|
| 4,928,073 A | * | 5/1990 | Arai et al. .................... | 330/252 |
| 5,317,200 A | * | 5/1994 | Nishiyama ................... | 327/237 |
| 5,345,346 A | * | 9/1994 | Brannon et al. ............. | 330/254 |
| 5,418,494 A | * | 5/1995 | Betti et al. ................... | 330/254 |
| 5,448,772 A | * | 9/1995 | Grandfield ................... | 455/333 |
| 5,532,637 A | * | 7/1996 | Khoury et al. ............... | 327/359 |
| 5,630,228 A | * | 5/1997 | Mittel .......................... | 455/333 |
| 5,896,063 A | * | 4/1999 | Marsh et al. ................ | 327/359 |
| 5,912,583 A | * | 6/1999 | Pierson et al. .............. | 327/563 |
| 5,933,771 A | * | 8/1999 | Tiller et al. .................. | 455/333 |
| 6,029,059 A | * | 2/2000 | Bojer .......................... | 455/333 |

* cited by examiner

Primary Examiner—Terry D. Cunningham
Assistant Examiner—Long Nguyen
(74) Attorney, Agent, or Firm—Oblon, Spivak, McClelland, Maier & Neustadt, P.C.

(57) ABSTRACT

An analog switch circuit is disclosed. A plurality of cell switches (10) and load resistors (33, 34) are employed. One of cell switches (10A) is active and another (10B) is nonactive by controlling switches (15). Each of cells includes two pair of common-base transistors (3 to 6), which are inserted between a differential amplifier (1, 2) and load resistors (33, 34). Each of bases of common-base transistors (3 to 6) isolate the collector from the base. Thereby, effects of collector-to-emitter capacitances of nonactive transistors are decreased in high frequency range. The remarkably small leakages are canceled out by paired transistors 5 and 4, and, 6 and 3. Thus, the cross-talk between 21a, 22a and 21b, 22b is eliminated.

8 Claims, 9 Drawing Sheets

ANALOG SWITCH CIRCUIT

BACKGROUND OF THE INVENTION

1. Field of the Invention

The present invention relates to an analog switch circuit. The circuit has a plurality of analog differential signal inputs. Therein, one of signal inputs is selected.

The invention is particularly concerned with a wideband switch for switching differential input signals of DC to several GHz. The switch has low cross-talk characteristics isolated from non-selected signal channels.

2. Description of the Prior Art

A conventional oscilloscope has a switching circuit to select an input signal channel from a plurality of analog differential input signal channels.

Figure 1:
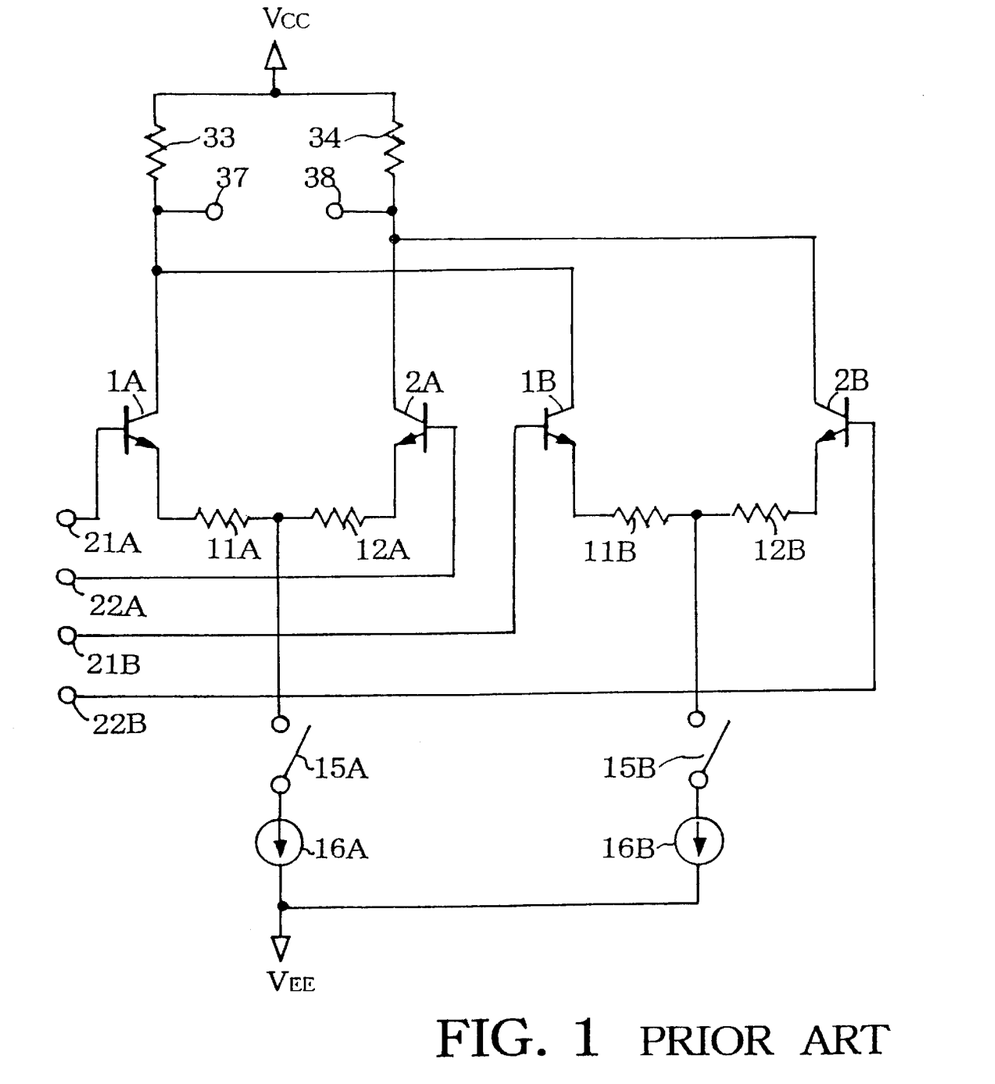
FIG. 1 is a circuit diagram of an analog switch circuit in accordance with the prior art.

Prior Art 1 of a conventional analog switch circuit is shown in FIG. 1.

In FIGS. 1, 21A and 22A are the first channel differential signal input terminals, which are respectively connected to bases of transistors 1A and 2A. In like manner, 21B and 22B are the second channel differential signal input terminals, which are respectively connected to bases of transistors 1B and 2B.

Emitters of transistors 1A and 2A are connected with each other via resistors 11A and 12A. The junction point of resistors 11A and 12A is connected with a terminal of a constant current source 16A via a switch 15A. Another terminal of the source 16A is connected to a power source $V_{EE}$.

Emitters of transistors 1B and 2B are connected with each other via resistors 11B and 12B. The junction point of resistors 11B and 12B is connected with a terminal of a constant current source 16B via a switch 15B. Another terminal of the source 16B is connected to the power source $V_{EE}$.

Collectors of transistors 1A and 1B are connected to a power source $V_{CC}$ via a load resistor 33. Collectors of transistors 2A and 2B are connected to the power source $V_{CC}$ via a load resistor 34.

A pair of transistors 1A and 2A forms a differential amplifier. Another pair of transistors 1B and 2B forms another differential amplifier.

When the switch 15A is on and the switch 15B is off, the first pair of transistors 1A and 2A amplifies the first differential input signal between input terminals 21A and 22A to obtain a differential output between differential signal output terminals 37 and 38. The second pair of transistors 1B and 2B does not amplify the second differential input signal between input terminals 21B and 22B, because of no collector currents of transistors 1B and 2B.

When the switch 15A is off and the switch 15B is on, reversely, the second pair of transistors 1B and 2B amplifies the second differential input signal between input terminals 21B and 22B to obtain a differential output between differential signal output terminals 37 and 38. The first pair of transistors 1A and 2A does not amplify the first differential input signal between input terminals 21A and 22A, because of no collector currents of transistors 1A and 2A.

Therefore, by means of on-off switching operation of switches 15A and 15B, the analog switch circuit shown in FIG.1 can selectively amplify a signal of two differential input signals. The first signal between input terminals 21A and 22A, or the second signal between input terminals 21B and 22B, is selectable.

In FIG. 1, two differential amplifiers of two pairs of transistors 1A, 2A and 1B, 2B are shown. Many differential amplifiers with switches 15s are usable, too. When only one of switches 15s is on and the other switches 15s are off, the only one differential signal is amplified to obtain the output between terminals 37 and 38. However, the other differential input signals are not amplified.

The analog switch circuit shown in FIG. 1 has the disadvantage of cross-talk, because of base-to-collector capacitances $C_{bc}$s.

In spite of no collector current, high frequency ingredients of the input signals of bases leak out to collectors via the capacitances $C_{bc}$s.

Figure 2:
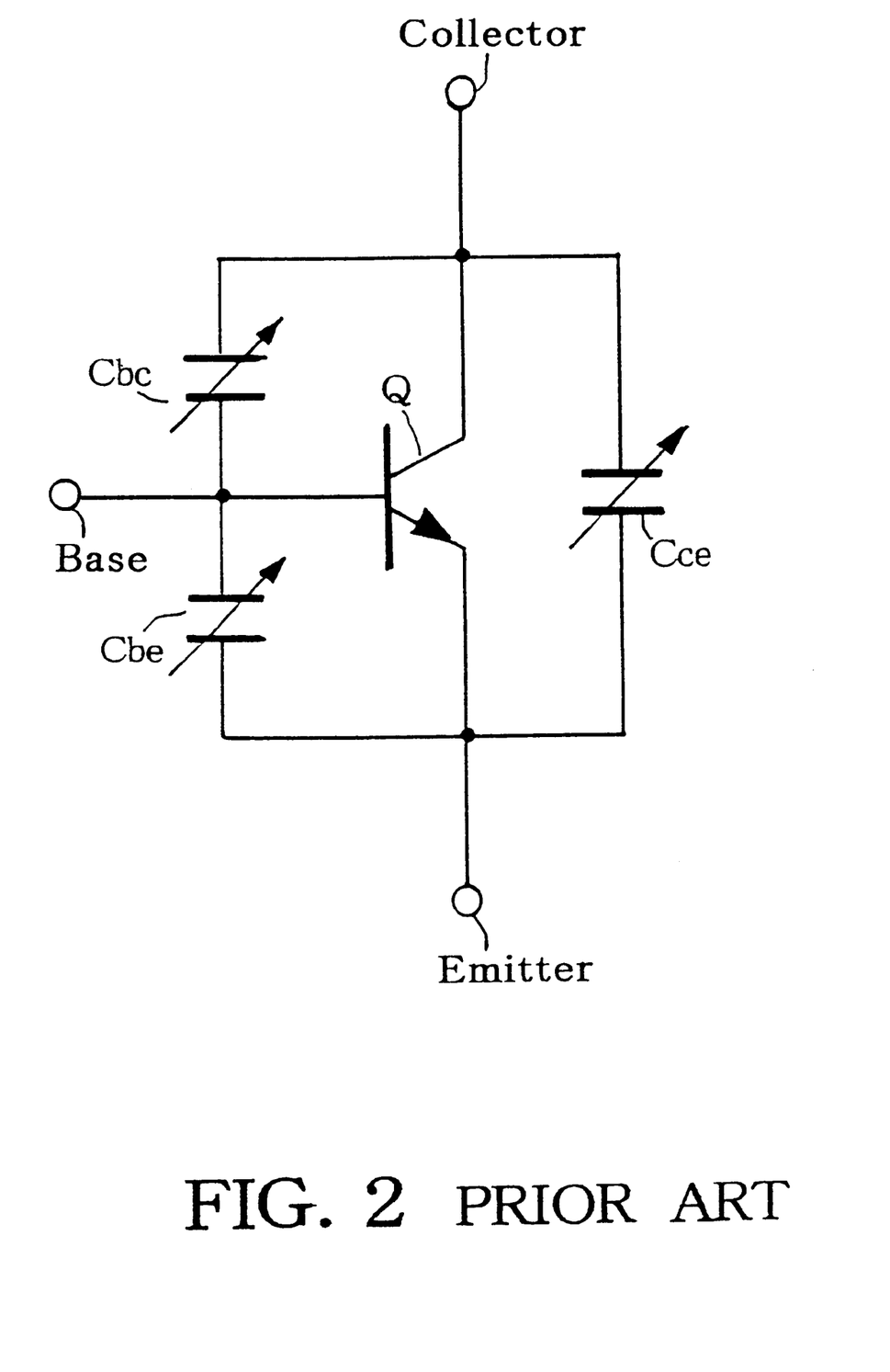
FIG. 2 is a circuit diagram showing capacitances of a transistor in accordance with the prior art.

In FIG. 2, there are shown a base-to-collector capacitance $C_{bc}$, a base-to-emitter capacitance $C_{be}$ and a collector-to-emitter capacitance $C_{ce}$.

Figure 3:
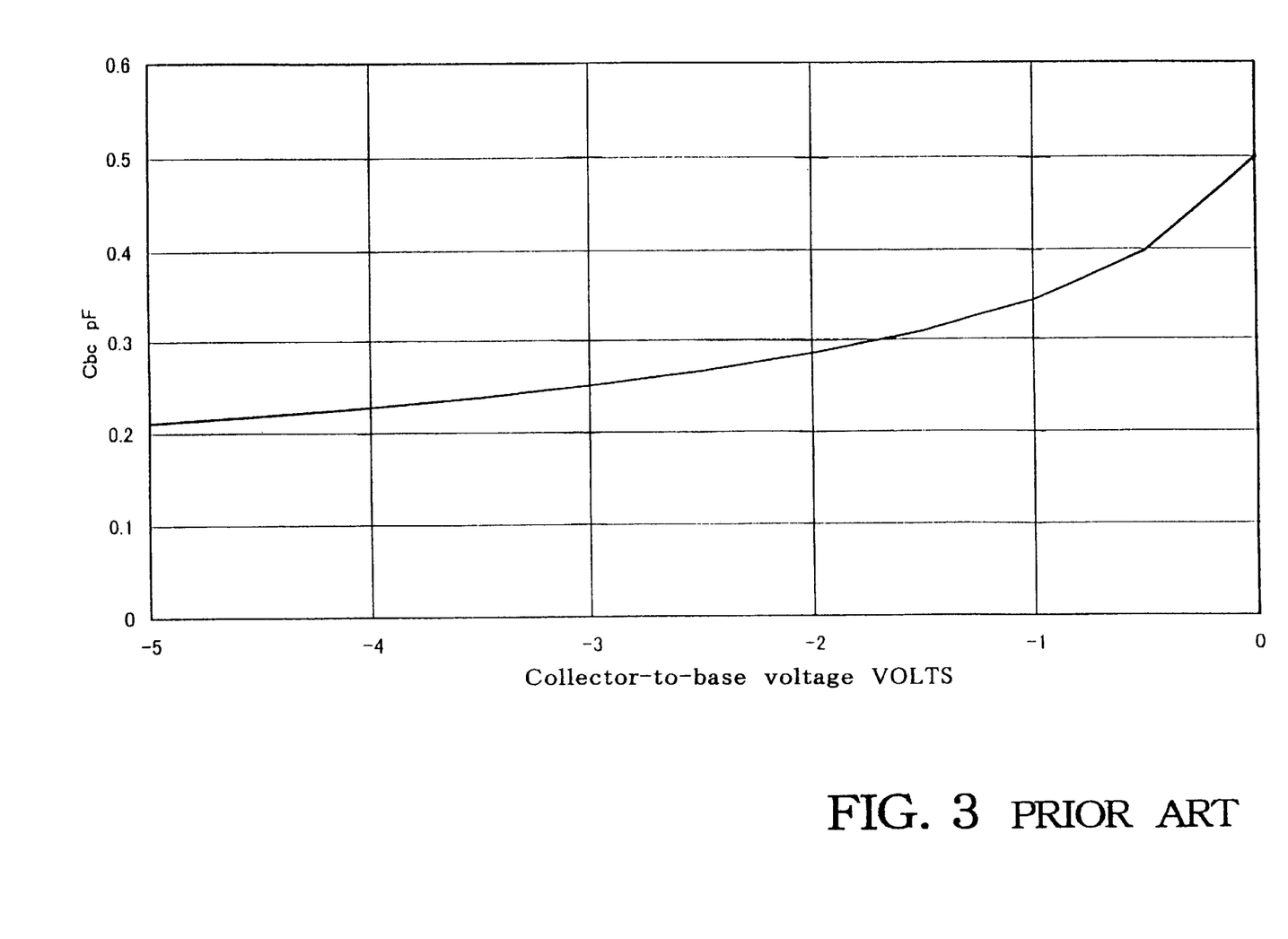
FIG. 3 is a typical collector voltage to capacitance characteristic of a transistor in accordance with the prior art.

In FIG. 3, there is shown the base-to-collector capacitance $C_{bc}$ depending on the collector-to-base voltage.

The base-to-emitter capacitance $C_{be}$ and the collector-to-emitter capacitance $C_{ce}$, which are not shown in FIG. 3, have the same characteristics as that of the base-to-collector capacitance $C_{bc}$.

Prior Art 2 is shown in Japanese Provisional Publication No. 10-285006. Therein, an analog switch circuit is disclosed. The circuit employs means to leak high frequency ingredients for reducing the cross-talk.

Figure 4:
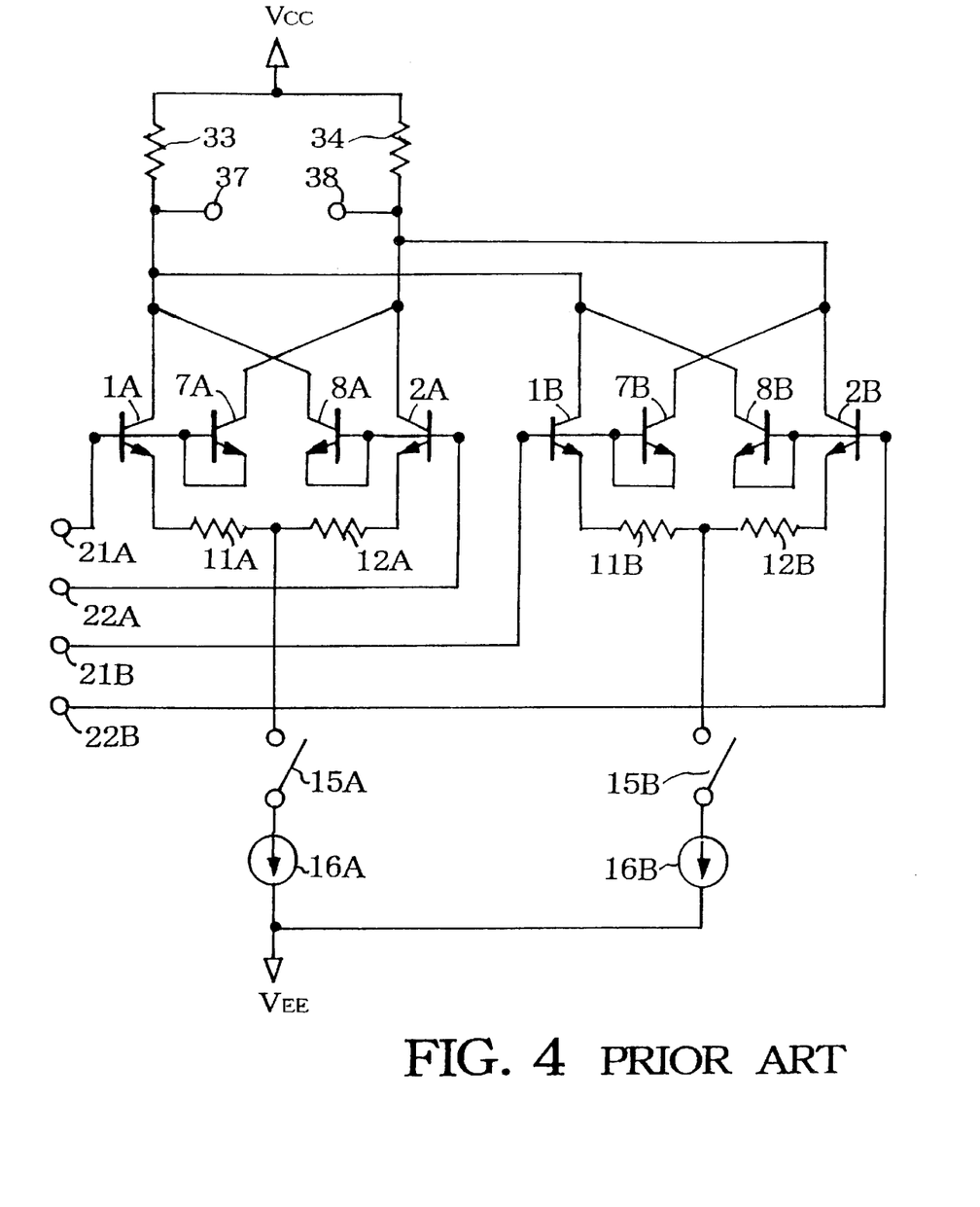
FIG. 4 is a circuit diagram of an analog switch circuit with means to leak high frequency ingredients for reducing crosstalk in accordance with the prior art.

In FIG. 4, the circuit of the prior art 2 is shown. The first differential signal input terminals 21A and 22A are respectively connected to bases of transistors 1A and 2A.

The second differential signal input terminals 21B and 22B are respectively connected to bases of transistors 1B and 2B.

Emitters of the transistors 1A and 2A are connected to each other via resistors 11A and 12A. The junction point of resistors 11A and 12A is connected with a terminal of a constant current source 16A via a switch 15A. Another terminal of the source 16A is connected to a power source $V_{EE}$.

In like manner, emitters of the transistors 1B and 2B are connected to each other via resistors 11B and 12B. The junction point of resistors 11B and 12B is connected with a terminal of a constant current source 16B via a switch 15B. Another terminal of the source 16B is connected to.the power source $V_{EE}$.

Transistors 7A, 8A, 7B and 8B are employed. In each of them, the emitter is connected with the base. The base of the transistor 7A is connected with that of 1A. In like manner, the base of 8A with 2A, 7B with 1B and 8B with 2B.

The collector of the transistor 7A is connected with that of 2A. In like manner, the collector of 8A with 1A, 7B with 2B and 8B with 1B.

Transistors 1A and 2A form a differential amplifier with means to leak high frequency ingredients for reducing the cross-talk. Transistors 7A and 8A operate as the leak means.

In like manner, transistors 1B and 2B form a differential amplifier with means to leak high frequency ingredients for reducing the cross-talk. Transistors 7B and 8B operate as the leak means.

When the switch 15A is on and the switch 15B is off, the first differential amplifier of transistors 1A and 2A amplifies the first differential input signal between input terminals 21A and 22A to obtain a differential output between differential signal output terminals 37 and 38.

The second differential amplifier of transistors 1B and 2B does not amplify the second differential input signal between the second differential input terminals 21B and 22B, because of no collector currents of transistors 1B and 2B.

However, a part of high frequency ingredients of the second differential input terminals 21B and 22B appears at collectors of transistors 1B and 2B by passing through base-to-collector capacitances $C_{bc}$s of transistors 1B and 2B.

Transistors 7B and 8B, which have base-to-collector capacitances $C_{bc}$s, leak a part of high frequency ingredients to collectors 2B and 1B in reverse phase respectively. Therefore, if the both leaks of transistors 1B and 8B are equal in their amplitude, the leaks can be canceled, because of their phase reverse to each other. In like manner, the leaks of transistors 2B and 7B can be canceled, because of their phase reverse to each other.

Actually, collector-to-base voltages of transistors 1B and 2B are not equal, and their base-to-collector capacitances are not same in value. Their capacitances vary in value depending on the collector-to-base voltages which are varied by differential input signal between input terminals 21B and 22B. Therefore, the cancellation by using leaks is not satisfied. The dispersion of base-to-collector capacitances is one of impedimental factors of the cancellation.

SUMMARY OF THE INVENTION

An object of the invention is to provide an analog switch circuit.

Another object of the invention is to provide a wideband analog switch circuit selecting a signal from differential signals without cross-talk.

A further object of the invention is to provide an analog switch circuit easy producible as a monolithic integrated circuit without cross-talk.

In the circuit of the invention, a plurality of cell switch means and a differential load means are included. Each of cell switch means includes a cell amplifying means and cell common-base means.

The cell amplifying means amplifies a differential input signal between differential input terminals to obtain a differential amplified signal between differential output terminals. The cell common-base means added with the differential amplified signal obtains a cell differential output. The output has the same polarity as or the reverse polarity to those of the differential input signal.

The differential load means supplies load currents to selected one of the plurality of cell switch means to obtain a differential signal output. The selected cell switch means is active and the others are nonactive.

Each of cell switch means includes a cell common-base means. Therefore, differential input signals added to nonactive cell switch means do not leak to differential signal output terminals.

The cell common-base means includes common-base transistors. When common-base transistors are off, input signals from emitters leak almost nothing to collectors, because grounded bases, which exist between emitters and collectors, insulate collectors from emitters.

In nonactive cell switch means, even remarkably reduced leak signals are canceled out by opposite polarity leak signals. Therefore, a wideband analog switch circuit switching signals of DC to several GHz is obtainable.

Additional objects and advantages of this invention will be apparent from the following detailed description of preferred embodiments thereof that proceed with reference to the accompanying drawings.

BRIEF DESCRIPTION OF THE DRAWINGS

The principle construction and operation of the present invention will be clearly understood from following detailed description taken in conjunction with the accompanying drawings, in which.

DESCRIPTION OF THE PREFERRED EMBODIMENTS

The present invention will be described hereinunder in detail with reference to the accompanying drawings.

Figure 5:
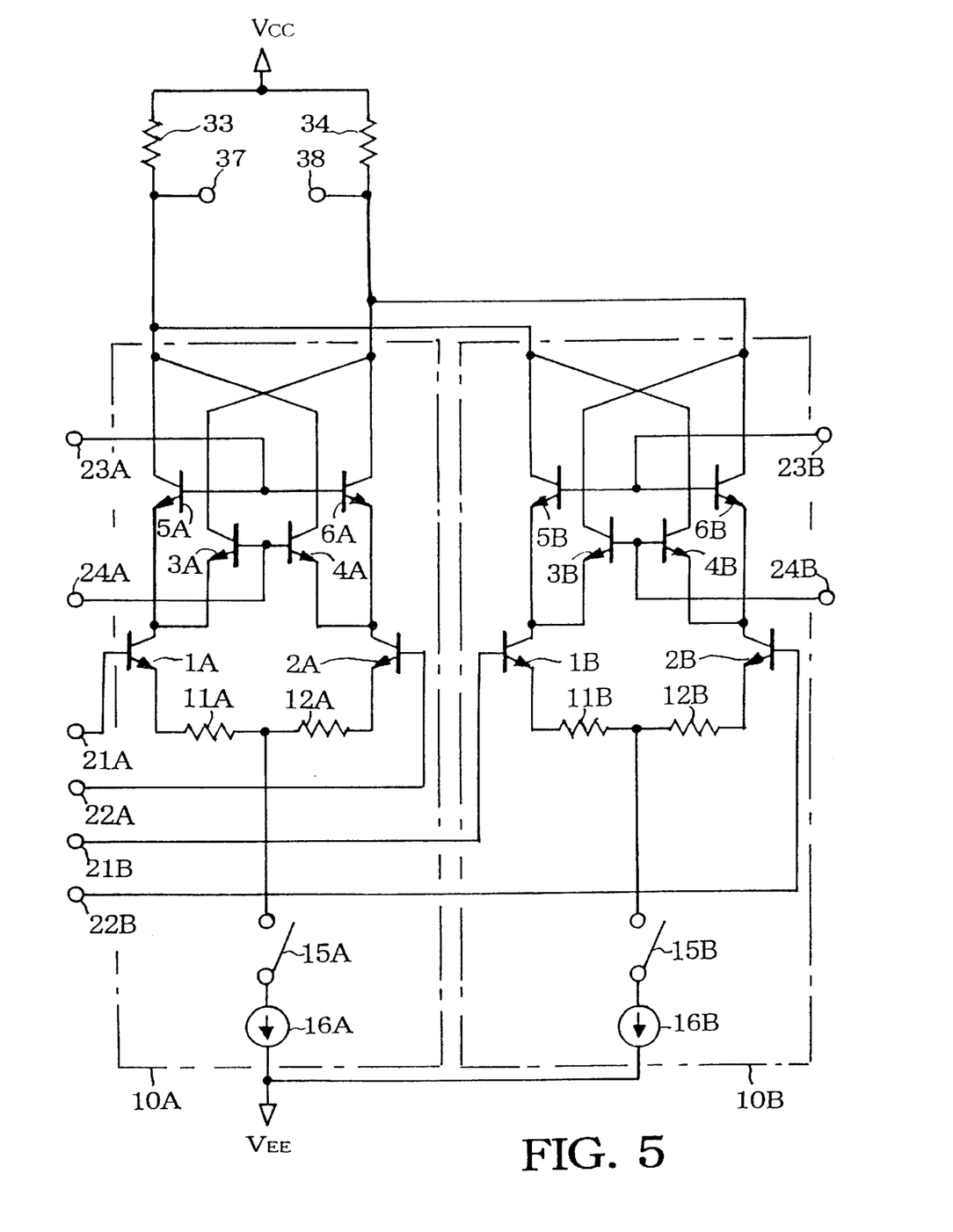
FIG. 5 is a circuit diagram of an analog switch circuit in accordance with the present invention.

FIG. 5 shows the first embodiment of an analog switch circuit in accordance with the present invention. In FIG. 5, elements similar to those previously described with reference to FIGS. 1 and 4 are denoted by the same reference numerals.

In a cell switch 10A, a differential input signal is applied to a pair of differential signal input terminals 21A and 22A. Terminals 21A and 22A are respectively connected to bases of transistors 1A and 2A. Transistors 1A and 2A form the first emitter-coupled differential amplifier.

In the first emitter-coupled differential amplifier, resistors 11A and 12A connect between emitters of transistors 1A and 2A. Resistors 11A and 12A give the effects of negative feedback to the differential amplifier.

The junction point of resistors 11A and 12A is connected with a terminal of a constant current source 16A via a switch 15A. Another terminal of the constant current source 16A is connected to a power source $V_{EE}$.

The collector of transistor 1A is connected with emitters of transistors 3A and 5A. The collector of transistor 2A is connected with emitters of transistors 4A and 6A.

Transistors 5A and 6A form the first common-base circuit. Transistors 3A and 4A form the second common-base circuit.

Collectors of transistors 5A and 4A are connected with a load resistor 33. Collectors of transistors 3A and 6A are connected with a load resistor 34.

In a cell switch 10B, a differential input signal is applied to a pair of differential signal input terminals 21B and 22B. Terminals 21B and 22B are respectively connected to bases of transistors 1B and 2B. Transistors 1B and 2B form the second emitter-coupled differential amplifier.

In the second emitter-coupled differential amplifier, resistors 11B and 12B connect between emitters of transistors 1B and 2B. Resistors 11B and 12B give the effects of negative feed-back to the differential amplifier.

The junction point of resistors 11B and 12B is connected with a terminal of a constant current source 16B via a switch 15B. Another terminal of the constant current source 16B is connected to the power source $V_{EE}$.

The collector of transistor 1B is connected with emitters of transistors 3B and 5B. The collector of transistor 2B is connected with emitters of transistors 4B and 6B.

Transistors 5B and 6B form the first common-base circuit. Transistors 3B and 4B form the second common-base circuit.

Collectors of transistors 5B and 4B are connected with the load resistor 33. Collectors of transistors 3B and 6B are connected with the load resistor 34.

The other terminals of load resistors 33 and 34 are connected to the power source $V_{cc}$. In common-base circuits, common-base voltages of base terminals 23A, 24A, 23B and 24B are individually controllable. Switching constant current sources, of which currents can be switched from predetermined value to zero, are usable for switches 15A, 15B and constant current sources 16A, 16B.

Assuming the cell switch 10A is on, and another cell switch 10B is off, the operation of the circuit shown in FIG. 5 will be described.

When the switch 15A is on and 15B is off, the first emitter-coupled differential amplifier including transistors 1A and 2A becomes active in the first cell switch 10A. At the same time, the second amplifier including transistors 1B and 2B becomes nonactive in the second cell switch 10B.

The differential input signal between a pair of differential terminals 21A and 22A is converted to signal currents by transistors 1A, 2A and negative feedback resistors 11A, 12A. Emitter and collector currents of transistors 1A and 2A depend on the amplitude of the differential input signal.

Collector current of the transistor 1A flows from transistors 3A and 5A. Collector current of the transistor 2A flows from transistors 4A and 6A. In base terminals 23A and 24A of common-base (i.e., grounded-base) circuits, it is assumed that the static voltage of the base terminal 23A, of which level is constant for an arbitrary period, is higher than that of 24A by 1 volt.

It is assumed that the static voltage of the base terminal 23A, of which level is constant for an arbitrary period, is lower than that of 24A by 1 volt. The collector current of transistor 1A flows from the load resistor 34 via the transistor 3A and the collector current of transistor 2A flows from the load resistor 33 via the transistor 4A. A differential output signal as the same phase as that of the differential signal input terminals 21A and 22A appears between differential signal output terminals 37 and 38.

It is assumed that the voltage of the base terminal 23A is lower than that of 24A by 1 volt. The collector current of transistor 1A flows from the load resistor 34 via the transistor 3A and the collector current of transistor 2A flows from the load resistor 33 via the transistor 4A. A differential output signal as the same phase as that of the differential signal input terminals 21A and 22A appears between differential signal output terminals 37 and 38.

Namely, the analog switch circuit of FIG. 5 delivers selectively a differential input signal between terminals 21A and 22A to differential signal output terminals 37 and 38. However, another differential input signal between terminals 21B and 22B is not selected as the switch 15B is off.

When the switch 15B is off, transistor 1B and 2B, which form an emitter-coupled differential amplifier in the cell switch 10B, are off. Therefore, the differential signal, which is inputted between terminals 21B and 22B, is not converted to a signal current. No signal current, therefore, flow common-base transistors 3B, 4B, 5B and 6B. Namely, transistors 3B, 4B, 5B and 6B are off.

In the addition, in spite of capacitances of transistors 1B to 6B, which are off, high frequency ingredients of the input signal between terminals 21B and 22B can not leak to differential signal output terminals 37 and 38. The effects reducing cross-talk will be described hereinafter.

When transistors 1B and 2B of the cell switch 10B are off, high frequency ingredients of the input signal between terminals 21B and 22B can leak to collectors of transistors 1B and 2B through their base-to-collector capacitances. The leakages are described in the prior arts 1 (FIG. 1) and 2 (FIG. 4). The signal leaked at collectors of transistors 1B and 2B would be flow to load resistors 33 and 34 via collector-to-emitter capacitances of common-base transistors 3B to 6B.

Common-base transistors have effects of isolation between collectors and emitters, as their bases, which exist between emitters and collectors, are grounded. Accordingly, input signals from emitters leak almost nothing to collectors of transistors being off.

When transistors are off, collector-to-emitter capacitances of common-base transistors are very or remarkably smaller than those of the prior art 2 or 1. Therefore, the cross-talk is decreased extremely or extraordinary smaller than those of the prior art 2 or 1, as the prior art 1 has no measure for preventing the leakage.

In common-base transistors 5B, 6B connected with a base terminal 23B, and 3B, 4B with 24B, it is supposed that a terminal voltage 23B equals to another terminal voltage 24B.

Those collector-to-emitter capacitances are very small, because of common-base transistors 3B, 4B and 5B, 6B. All of those capacitances are substantially equal to each others.

Accordingly, a small signal leaked to the collector of the transistor 5B equals to that of 4B in amplitude and is added to another in the reverse phase. At the same time, a small signal leaked to the collector of the transistor 6B equals to that of 3B in amplitude and is added to another in the reverse phase. The small leaked signals are, thereby, canceled out.

In nonactive cell switch 10B, which is off, signals leaked to terminals 37 and 38 are remarkably small by canceling.

An operation of active cell switch 10A and nonactive cell switch 10B has been described above. The other way, another operation of active cell switch 10B and nonactive cell switch 10A will be easily understandable from that of the operation above-mentioned.

Base control means delivering base voltages to base terminals 23A, 24A, 23B and 24B are not shown. Those base voltages are practically DC or the like. The same voltage of the terminal 23A as that of 24A is obtained by shorting both terminals. The same voltage of the terminal 23B as that of 24B is obtained by shorting both terminals. The base control means are very simple.

Effects of the analog switch circuit according to the invention will be simulated. Parameters used in the simulation will be shown. It is assumed that the dispersion of capacitances of transistors included in an IC is 5%.

Parameters of transistors are shown as follows.

(1) Forward transition time for a step input;
  TF=20 ps
(2) Capacitances;
  $C_{be}=C_{bc}=C_{cs}=0.6$ pF($\pm5\%$)

$C_{be}$; base-to-emitter
$C_{bc}$; base-to-collector
$C_{cs}$; collector-to-substratum (3) Bias dependent multiplication coefficient of junction capacitances
MJ=0.4

(4) Current of a current source 16
I=20 mA (5) Resistors 11 and 12 of emitters for negative feedback
R11=R12=100 Ω

(6) Load resistors 33 and 34
R33=R34=100 Ω

Figure 6:
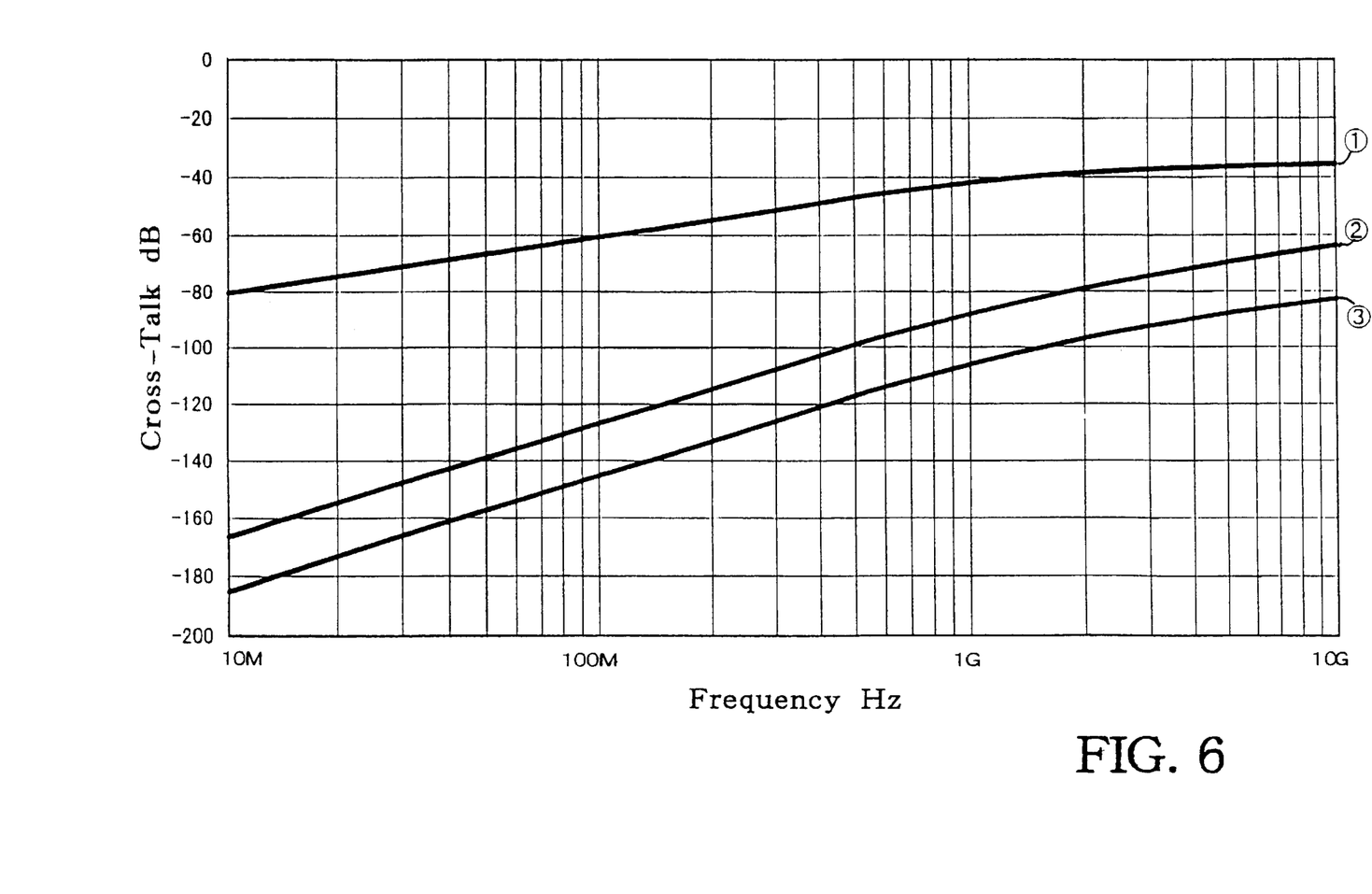
FIG. 6 is a cross-talk characteristic simulated in accordance with the present invention.

FIG. 6 shows simulated cross-talk characteristics of the analog switch circuits of the present invention and the prior art 2. The X and Y coordinates show signal frequencies by Hz and cross-talks by dB, respectively.

The curve ① shows a cross-talk characteristic of the prior art 2 shown in FIG. 4.

The curve ② shows a cross-talk characteristic of the present invention shown in FIG. 5, wherein the voltage of the terminal 24B is higher than that of 23B by 1 volt.

The curve ③ shows a cross-talk characteristic of the present invention shown in FIG. 5, wherein the voltage of the terminal 24B equals to that of 23B.

In comparison with the prior art 2 shown by the curve ①, the present invention shown by the curves ② and ③ realizes the analog switch circuit having remarkably small cross-talk. The curve ③, wherein the voltage of the terminal 24B equals to that of 23B, clearly shows the character superior to that of curve ②.

Figure 7:
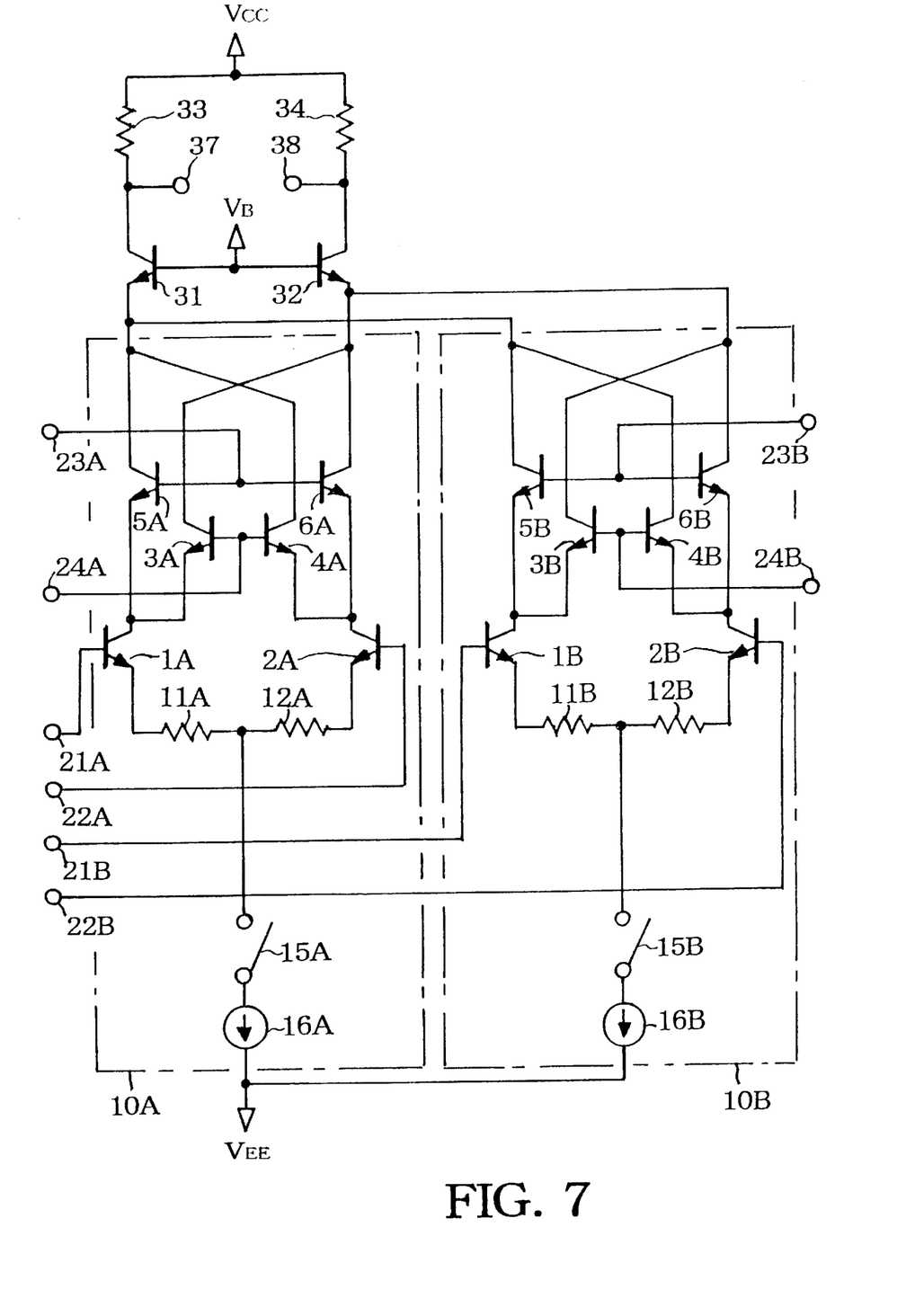
FIG. 7 is a circuit diagram of an analog switch circuit of the second embodiment in accordance with the present invention.

FIG. 7 shows the analog switch circuit of the second embodiment of the present invention. The reference numerals in FIG.7 are the same as those of FIG. 5.

Therefore, elements different from those of FIG. 5 will be described. In FIG. 7, common-base transistors 31 and 32 are connected between cell switches 10A, 10B and load resistors 33, 34. The bases of transistors 31 and 32 are connected to a bias source $V_B$. The common-base transistors 31 and 32 are in series to load resistors 33 and 34.

Although big amplitude output can be delivered between terminals 37 and 38, collector voltages of transistor 3B to 6B are substantially constant.

Therefore, collector-to-emitter capacitances of transistors 3B to 6B are constant without influence of amplitudes of the input signal voltage. The superior uniformity of capacitances is obtainable. The better effects to cancel out the leak than those of FIG. 5 are obtained.

There is another merit in the circuit of FIG. 7. In FIG. 5, collector capacitances of transistors 3A to 6A and 3B to 6B are directly connected with load resistors 33 and 34.

In FIG. 7, however, collector capacitances of only transistors 31 and 32 are connected with load resistors 33 and 34. The capacitances are small, because of the common-base transistors 31 and 32. The wideband characteristics are, therefore, improved.

Figure 8:
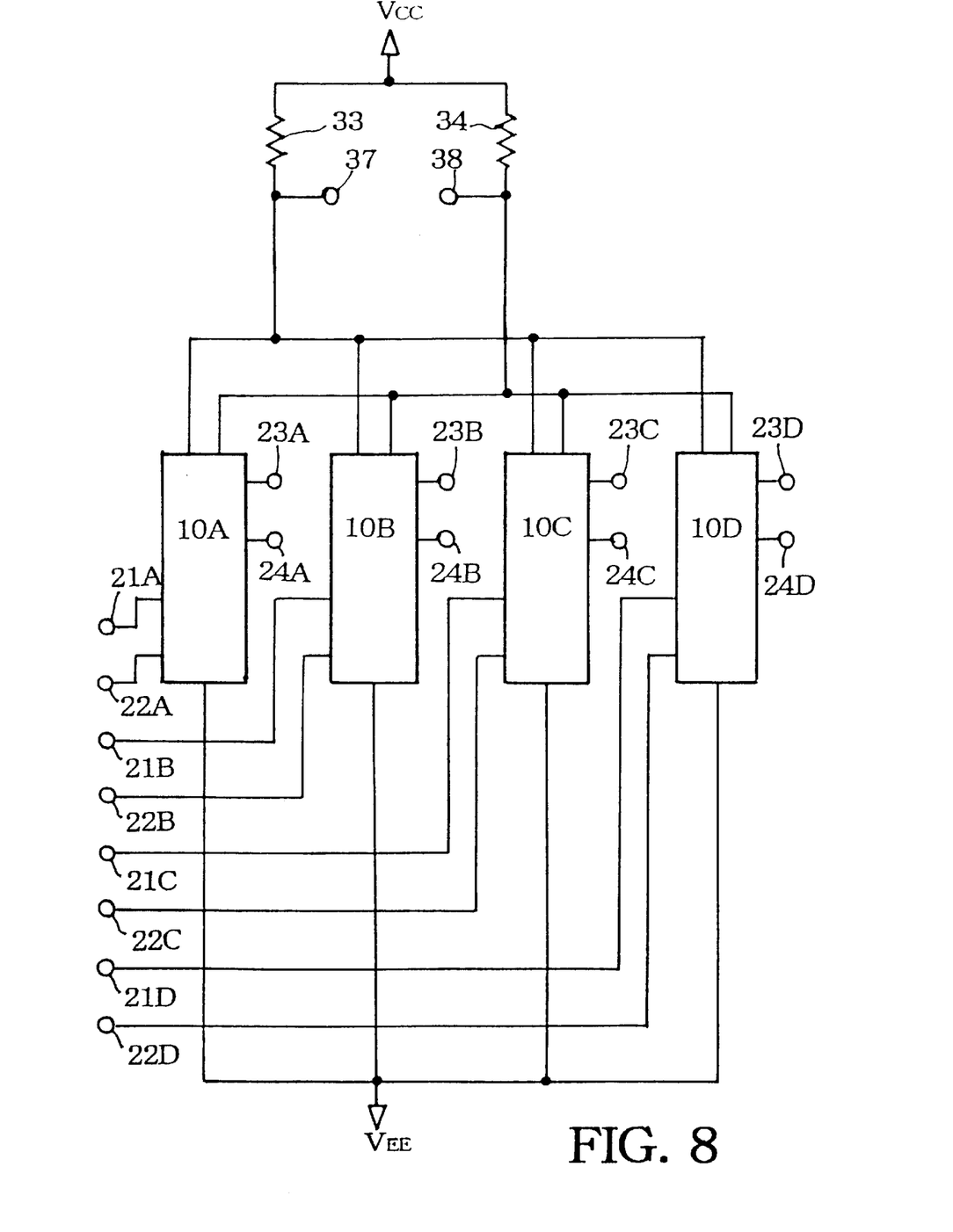
FIG. 8 is a circuit diagram of an analog switch circuit of the third embodiment in accordance with the present invention.

In FIG. 8, there is shown the circuit diagram of the third embodiment of the present invention. Four cell switches 10A to 10D are employed in FIG. 5.

Figure 9:
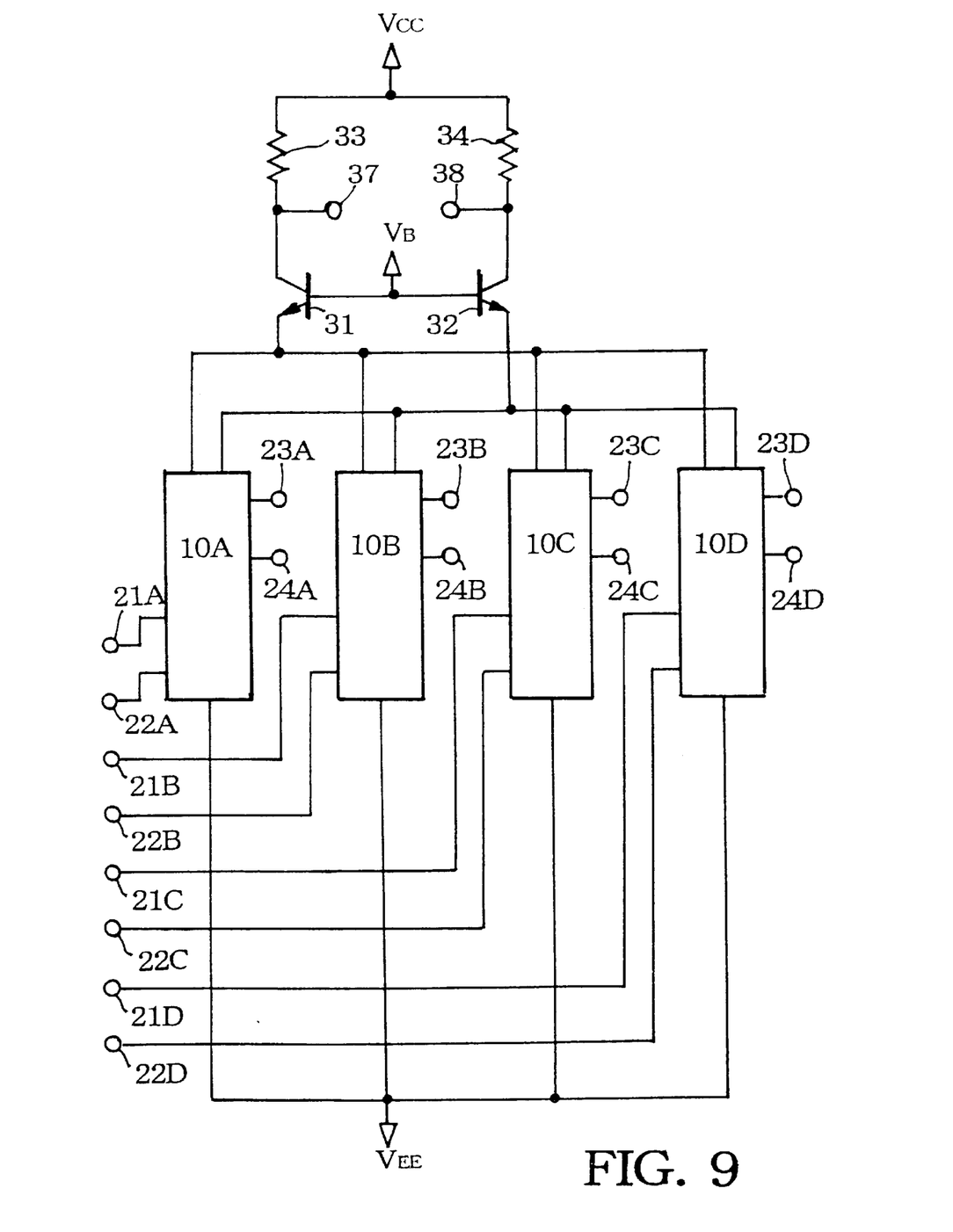
FIG. 9 is a circuit diagram of an analog switch circuit of the forth embodiment in accordance with the present invention.

In FIG. 9, there is shown the circuit diagram of the forth embodiment of the present invention. Four cell switches 10A to 10D are employed in FIG. 7.

The common-base transistors 31 and 32 remarkably eliminate the influence of capacitances of cell switches 10A to 10D to the load resistors 33 and 34. Therefore, the circuit of FIG. 9 is wider than of FIG. 8 in their bandwidth.

As shown in FIGS. 8 and 9, the number of cell switches 10s is the arbitrary plurality. Therein, one of them is on and the others are off. A differential input signal is selected from the other signals to obtain a differential output signals.

In FIGS. 5, 7, 8 and 9, it is assumed that resistances of emitter negative feedback resistors 11 and 12 equal to those of load resistor 33 and 34 (R11=R12=R33=R34).

The differential output signal between terminals 37 and 38 equals to the differential input signal between terminals 21 and 22 in amplitude. Namely, the voltage gain is 1. In like manner, if R11=R12, R33=R34 and R33=2R11 are employed, the voltage gain is 2.

The analog switch circuit of the present invention can switch signals of DC to several GHz to selectively obtain a differential output signal without cross-talk.

The circuit is easy producible as a small sized monolithic integrated circuit without cross-talk. The circuit can select a signal from a plurality of wideband differential input signals in high fidelity.

While the invention has been described in its preferred embodiments, it is to be understood that within the scope of the appended claims the invention can be practiced otherwise than as specifically described.

What is claimed is:

1. An analog switch circuit comprising:
   a plurality of cell switch means each including,
   cell amplifying means, of which amplifying function can be switched to be active or nonactive, receiving a differential input signal between a pair of differential signal input terminals to obtain an amplified differential output signal between a pair of amplified output terminals when the amplifying function is active by means of cell currents, and
   cell common-base means including first and second common-base circuits, each common base circuit including common-base transistors to pass the cell currents to the cell amplifying means receiving the amplified differential output signal, and obtaining selectively a same polarity signal as the differential input signal or a reverse polarity signal to the differential input signal as a cell differential output signal by controlling static levels of input signals being constant for an arbitrary period; and
   a differential load means delivering a differential output signal amplified from the differential input signal between a pair of output terminals by supplying the cell currents to the cell common-base means connected with the cell amplifying means being active.

2. An analog switch circuit according to claim 1, wherein the cell amplifying means includes, a pair of transistors, emitter resistors between emitters of the pair of transistors in which a junction point of the emitter resistors is connected to a current source means which can switch the amplifying function to be active or nonactive, and the amplified differential output signal is obtained between collectors of the transistors.

3. An analog switch circuit according to claim 1, wherein the cell common-base means operates so as to amplify the amplified differential output signal from the cell amplifying means for obtaining the cell differential output signal when the amplifying function is active, and not to amplify the amplified differential output signal from the cell amplifying means for obtaining no cell differential output signal when the amplifying function is nonactive.

4. An analog switch circuit according to claim 1, wherein each of the cell switch means including the cell amplifying means of which amplifying function is nonactive includes the input signals between which voltage difference is zero.

5. An analog switch circuit according to claim 1, wherein
the differential load means includes a first and a second load resistors in which a terminal of each of the load resistors is connected to a power source and another terminal of each of the load resistors is differentially applied with the cell differential output signal to obtain the differential output signal.

6. An analog switch circuit according to claim 1, wherein
the differential load means includes two common-base transistors of which emitters are applied with the cell differential output signal, and a first and a second load resistors, in which a terminal of each of the load resistors is connected to a power source and another terminal of each of the load resistors is connected to each of the collectors of the common-base transistors to obtain the differential output signal.

7. An analog switch circuit according to claim 1, wherein
the input signals of the cell switch means are set so as to obtain the same polarity signal as or the reverse polarity signal to the differential input signal as the cell differential output signal.

8. An analog switch circuit comprising:

a plurality of cell switch means each including, cell amplifying means, of which amplifying function can be switched to be active or nonactive, receiving a differential input signal between a pair of differential signal input terminals to obtain an amplified differential output signal between a pair of amplified output terminals when the amplifying function is active by means of cell currents, and cell common-base means including common-base transistors to pass the cell currents to the cell amplifying means receiving the amplified differential output signal, and obtaining selectively a same polarity signal as the differential input signal or a reverse polarity signal to the differential input signal as a cell differential output signal by controlling static levels of input signals being constant for an arbitrary period; and a differential load means delivering a differential output signal amplified from the differential input signal between a pair of output terminals by supplying the cell currents to the cell common-base means connected with the cell amplifying means being active;

wherein the cell common-base means includes a first pair of a first transistor and a second transistor of which bases are coupled, and a second pair of a first transistor and a second transistor of which bases are coupled, in which emitters of both of the first transistors of the first and second pairs are connected to one of a pair of amplified output terminals, emitters of both of the second transistors of the first and second pairs are connected to another of the pair of amplified output terminals, collectors of the first transistor of the first pair and the second transistor of the second pair are connected to one of terminals between which the cell differential output signal is delivered, and collectors of the second transistor of the first pair and the first transistor of the second pair are connected to another of terminals between which the cell differential output signal is delivered.

\* \* \* \* \*